(12) United States Patent
Merchant et al.

(10) Patent No.: US 7,932,189 B2
(45) Date of Patent: Apr. 26, 2011

(54) PROCESS OF FORMING AN ELECTRONIC DEVICE INCLUDING A LAYER OF DISCONTINUOUS STORAGE ELEMENTS

(75) Inventors: Tushar P. Merchant, Austin, TX (US); Chun-Li Liu, Mesa, AZ (US); Ramachandran Muralidhar, Austin, TX (US); Marius K. Orlowski, Austin, TX (US); Rajesh A. Rao, Austin, TX (US); Matthew Stoker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 11/627,817

(22) Filed: Jan. 26, 2007

(65) Prior Publication Data

US 2008/0182428 A1    Jul. 31, 2008

(51) Int. Cl.
*H01L 21/31* (2006.01)

(52) U.S. Cl. ........ 438/787; 438/260; 438/257; 438/263; 438/264; 438/197; 257/E21.21; 257/E21.409; 257/E21.4; 977/932; 977/943

(58) Field of Classification Search .......... 438/97, 438/197, 211, 257, 263–264, 260; 257/E21.404, 257/E29.301, E21.21, E21.409, E21.4; 977/932, 977/943
See application file for complete search history.

(56) References Cited

U.S. PATENT DOCUMENTS

| | | | | |
|---|---|---|---|---|
| 4,814,291 A | * | 3/1989 | Kim et al. | 438/593 |
| 4,830,890 A | * | 5/1989 | Kanai | 427/255.39 |
| 5,691,939 A | * | 11/1997 | Chang et al. | 365/185.18 |
| 6,090,666 A | * | 7/2000 | Ueda et al. | 438/257 |
| 6,218,315 B1 | | 4/2001 | Ballamine et al. | |
| 6,297,095 B1 | * | 10/2001 | Muralidhar et al. | 438/257 |
| 6,451,641 B1 | * | 9/2002 | Halliyal et al. | 438/200 |
| 6,465,373 B1 | * | 10/2002 | Zheng et al. | 438/794 |
| 6,816,414 B1 | * | 11/2004 | Prinz | 365/185.29 |
| 2002/0076850 A1 | * | 6/2002 | Sadd et al. | 438/90 |
| 2003/0211680 A1 | | 11/2003 | Arghavani et al. | |

OTHER PUBLICATIONS

DiMaria, et al.; "Impact ionization, trap creation, degradation, and breakdown in silicon dioxide films on silicon"; pp. 3367-3384; J. Appl. Phys. 73 (7); Apr. 1, 1993.
Wolf, Stanley et al., "Silicon Processing for the VLSI Era, Volume 1: Process Technology," Lattice Press, CA, 1986, p. 217.

* cited by examiner

*Primary Examiner* — A. Sefer
*Assistant Examiner* — Ermias Woldegeorgis

(57) ABSTRACT

An electronic device can include a layer of discontinuous storage elements. A dielectric layer overlying the discontinuous storage elements can be substantially hydrogen-free. A process of forming the electronic device can include forming a layer including silicon over the discontinuous storage elements. In one embodiment, the process includes oxidizing at least substantially all of the layer. In another embodiment, the process includes forming the layer using a substantially hydrogen-free silicon precursor material and oxidizing at least substantially all of the layer.

20 Claims, 3 Drawing Sheets

US 7,932,189 B2

PROCESS OF FORMING AN ELECTRONIC DEVICE INCLUDING A LAYER OF DISCONTINUOUS STORAGE ELEMENTS

BACKGROUND

1. Field of the Disclosure

The present disclosure relates to electronic devices, more particularly, to electronic devices that include discontinuous storage elements and process for forming them.

2. Description of the Related Art

A process of forming a nonvolatile memory cell within an electronic device can include forming a charge storage stack. The charge storage stack can be formed by depositing discontinuous storage elements ("DSEs") over a thermally grown oxide layer and then forming another dielectric layer over the DSEs to substantially encapsulate the DSEs. Forming a film over of the DSEs is problematic. The film can be formed by thermally growing it from the material within the DSEs; however, this process consumes the DSEs radially. Thus, as the encapsulation layer increases in thickness, the radius of the individual DSEs is reduced by a value linearly, but the volume of an individual DSE is reduce by a cubic function of the same value. Also, the DSEs may not include a material that forms an insulating oxide or nitride. Alternatively, the film can be deposited using (i) silane ($SiH_4$) or dichlorosilane ($SiCl_2H_2$) and (ii) an oxygen-containing gas or a nitrogen-containing gas.

The nonvolatile memory cell can be programmed by hot carrier injection ("HCI"). When the overlying film includes the deposited film, electron traps can be formed within the deposited film. The presence of such electron traps degrades the dielectric properties of the dielectric material such that eventually, the charge storage region is no longer electrically floating and is unable to store charge. A thermally grown film is less likely to form traps; however, the DSEs are consumed during formation of the thermally grown film.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
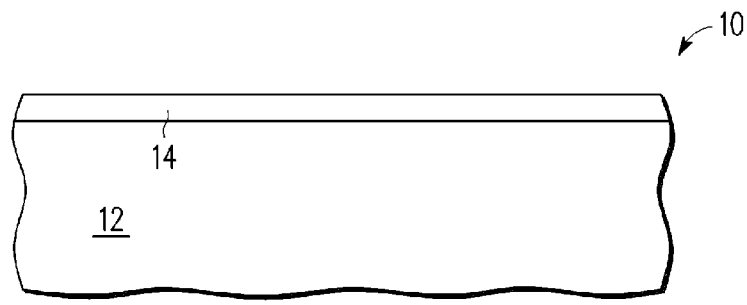
FIG. 1 includes an illustration of a cross-sectional view of a workpiece including a substrate and a dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device includes discontinuous storage elements and a dielectric layer. In a first aspect, a process of forming an electronic device can include forming a layer of discontinuous storage elements over a dielectric layer. The process can also include forming a layer including silicon over the discontinuous storage elements and oxidizing at least substantially all of the silicon layer.

In a second aspect, an electronic device can include a substrate, a first dielectric layer, and a first layer of discontinuous storage elements wherein the first dielectric layer lies between the first layer of discontinuous storage elements and the substrate. The electronic device can also include a second dielectric layer overlying the discontinuous storage elements wherein the second dielectric layer is substantially hydrogen-free.

In a third aspect, a process of forming an electronic device can include forming a layer of discontinuous storage elements over a dielectric layer and passivating the discontinuous storage elements. The process can also include forming a first layer over the discontinuous storage elements after passivating the discontinuous storage elements, wherein forming the first layer is performed using a silicon precursor that is substantially hydrogen-free. The process can further include forming a dielectric layer wherein forming the dielectric layer includes oxidizing at least substantially all of the first layer.

An electronic device may be formed having dielectric layer including substantially no hydrogen. In accordance with a specific embodiment, a silicon layer is formed using a substantially hydrogen-free precursor material, and the silicon layer is oxidized to form a dielectric layer. The dielectric layer formed in such a manner includes less hydrogen than a conventionally formed dielectric layer. Thus, the dielectric layer is less likely to form electron traps, or forms fewer electron traps, than a dielectric layer formed using hydrogen-containing material. As a result, the usable life of the electronic device is extended. Specific embodiments of the present disclosure will be better understood with reference to FIGS. 1 through 9.

Some terms are defined or clarified as to their intended meaning as they are used within this specification.

The term "discontinuous storage elements" is intended to mean spaced-apart objects capable of storing a charge within a memory cell. Discontinuous storage elements include conductive material, semiconductive material, insulating material, or any combination thereof. In one embodiment, substantially all discontinuous storage elements may be initially formed and remain separate from one another. In another embodiment, a substantially continuous layer of material is formed and later separated into discontinuous storage elements. In yet another embodiment, substantially all discontinuous storage elements may be initially formed separate from one another, and later during the formation, some but not all of the discontinuous storage elements may coalesce.

The term "stack" is intended to mean a plurality of layers or a plurality of at least one layer and at least one structure (e.g., nanocrystals), wherein the plurality of layers or plurality of layer(s) and structure(s) provides an electronic function. For example, a nonvolatile memory stack includes layers used to form at least part of a nonvolatile memory cell. A stack may be part of a larger stack. For example, a nonvolatile memory stack can include a charge storage stack that is used to store charge within a nonvolatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

FIG. 1 includes an illustration of a cross-sectional view of a portion of a workpiece 10 where an electronic device is being formed. In the illustrated embodiment, the workpiece 10 includes a substrate 12 and a dielectric layer 14. Substrate 12 includes a semiconductor material such as silicon, germanium, carbon, another semiconductor material, such as a III-V material or a II-VI material, or any combination thereof. Although illustrated as a bulk semiconductor material, the substrate 12 can include other types of substrates capable of forming an electronic device such as a semiconductor on sapphire, a semiconductor on insulator, or another semiconductor substrate. In a particular embodiment, the substrate 12 includes a conductive material and act as an electrode.

The dielectric layer 14 is formed over the substrate 12. In the illustrated embodiment, the dielectric layer 14 is a tunnel dielectric and serves as a first portion of a charge storage stack. The dielectric layer 14 includes an oxide, a nitride, an oxynitride, or any combination thereof and has a thickness in a range of approximately 2 to approximately 10 nm. In a particular embodiment, the dielectric layer 14 has a thickness in a range of approximately 3 to approximately 8 nm. In other embodiments, the dielectric layer 14 may have other thicknesses. In another embodiment, the dielectric layer includes a high-k dielectric material. The dielectric layer 14 is grown or deposited using a conventional or proprietary technique.

Figure 2:
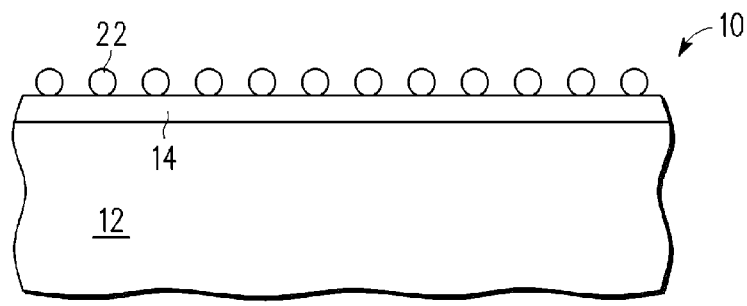
FIG. 2 includes an illustration of a cross-sectional view of the workpiece of FIG. 1 after forming a layer of discontinuous storage elements.

FIG. 2 includes an illustration of the workpiece 10 after forming a layer of discontinuous storage elements 22 over the dielectric layer 14. In the illustrated embodiment, the layer of DSEs 22 serves as a charge storage region of a charge storage stack. The layer of DSEs 22 can include silicon nanocrystals, metal nanoclusters, or any combination thereof. In one particular embodiment, a substantially continuous layer of amorphous silicon can be formed. The substantially continuous layer can be exposed to heat or other processing conditions that can cause the layer to "ball up" or otherwise form silicon nanocrystals. DSEs 22 may be undoped, doped during deposition, or doped after deposition. In one embodiment, DSEs 22 are formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. An individual DSE of the layer of DSEs 22 has an average diameter in a range of approximately 2 to approximately 20 nm. In one embodiment, each of DSEs 22 is no greater than approximately 10 nm in any dimension. In another embodiment, DSEs 22 are larger, however, DSEs 22 are not formed so large as to form a continuous structure (i.e., all DSEs 22 are not fused together) in a finished electronic device. Although illustrated as a planar deposition, in another embodiment, the layer of DSEs 22 can be formed on walls such as with a fin of a MIGFET or the walls of a trench.

Figure 3:
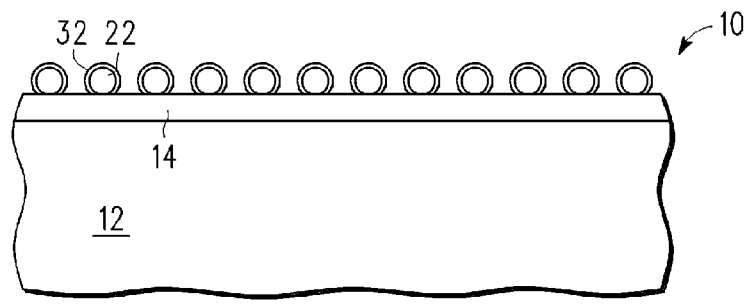
FIG. 3 includes an illustration of a cross-sectional view of the workpiece of FIG. 2 after forming a barrier layer over the discontinuous storage elements.

FIG. 3 includes an illustration of the workpiece 10 after forming a protective layer 32 over most of the layer of DSEs 22. In the illustrated embodiment, the protective layer 32 serves to passivate the DSEs 22. In one embodiment, the protective layer 32 protects the DSEs 22 during subsequent processing. In another embodiment, the protective layer 32 includes an oxide, a nitride, an oxynitride, or any combination thereof. The protective layer 32 can have a thickness of up to approximately 2 nm. In still another embodiment, the protective layer 32 may have other thicknesses. In a particular embodiment, the protective layer 32 has a thickness in a range of approximately 1 to approximately 1.5 nm. In the illustrated embodiment, the layer of DSEs 22 is oxidized, and the substrate 12 is subsequently placed in a nitridizing environment. In one embodiment, the nitridizing environment includes a nitrogen plasma.

Figure 4:
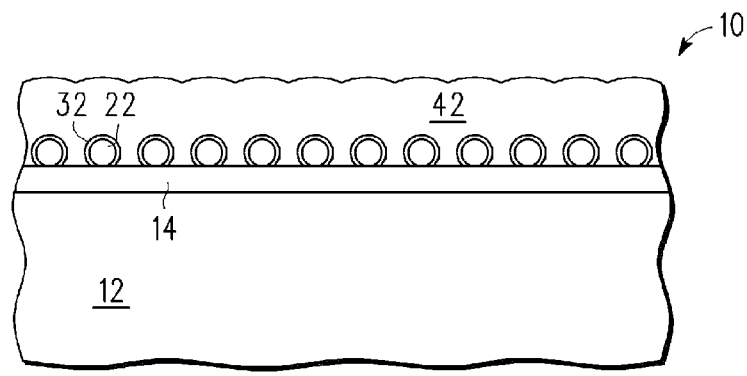
FIG. 4 includes an illustration of a cross-sectional view of the workpiece of FIG. 3 after forming a layer.

FIG. 4 includes an illustration of the workpiece 10 after forming a layer 42. The layer 42 covers the layer of DSEs 22 and can subsequently be converted to a dielectric layer. In the illustrated embodiment, the layer 42 includes silicon. In a particular embodiment, the layer 42 is an amorphous silicon layer and, in a more particular embodiment, is formed using a silicon precursor material that is substantially hydrogen-free. In another particular embodiment, the silicon precursor includes a halogen. In a still more particular embodiment, the silicon precursor can have a chemical formula of $Si_ZX_{2X+2}$ where Z is equal to 1, 2, or 3, and "X" includes F, Cl, Br, I, or any combination thereof. In an even still more particular embodiment, the silicon precursor includes $SiCl_4$, $SiBr_4$, $SiF_4$, $Si_2Cl_4Br_2$, or any combination thereof.

In one embodiment, the layer 42 is deposited using either a hot wall process in the absence of a plasma with a pressure in a range of approximately 100 to approximately 400 mTorr. In another embodiment, the layer 42 is deposited using a cold wall process in the presence of a plasma with a pressure in a range of approximately 1 to approximately 99 Torr. In yet another embodiment, the layer 42 may be deposited at another pressure. When depositing the layer 42, a ballast gas, such as nitrogen, a noble gas, or any combination thereof, can also be present. The layer 42 can have a thickness in a range of approximately 3 to approximately 9 nm. In a particular embodiment, the layer 42 has a thickness in a range of approximately 4 to approximately 6 nm.

Figure 5:
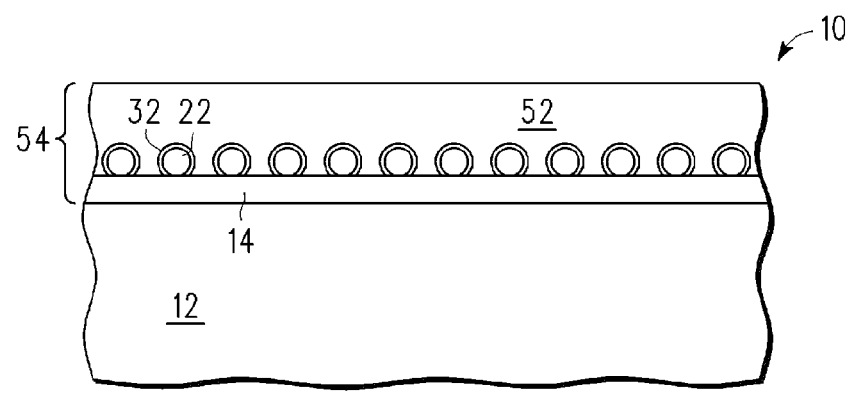
FIG. 5 includes an illustration of a cross-sectional view of the workpiece of FIG. 4 after forming a dielectric layer from the layer.

FIG. 5 includes an illustration of the workpiece 10 after forming the dielectric layer 52 and completing a charge storage stack 54. The dielectric layer 52 can serve to help insulate the DSEs 22 from a subsequently formed gate electrode. When forming the dielectric layer 52, the layer 42 is exposed to reactive conditions, and in one embodiment, at least substantially all of the layer 42 is reacted to form a dielectric layer 52. The dielectric layer 52 can include a material previously described with respect to the dielectric layer 14.

In the illustrated embodiment, the layer 42 is amorphous silicon and is exposed to an oxygen-containing environment at a temperature of greater than 650 degrees centigrade. In a particular embodiment, the oxygen-containing environment is substantially hydrogen-free. In a more particular embodiment, the oxygen-containing environment includes $O_2$, $O_3$, $N_2O$, NO, or any combination thereof. In such a case, the dielectric layer 52 includes silicon dioxide and, in a particular embodiment, the dielectric layer 52 is substantially hydrogen-free. The dielectric layer 52 has a thickness in a range of approximately 8 to approximately 20 nm, depending on the original thickness of the layer 42 and how long the layer 42 is exposed to the oxygen-containing environment. In one embodiment, substantially none the layer 42 remains after exposure. The completion of the dielectric layer 52 also completes the formation of the charge storage stack 54. As illustrated, the charge storage stack 54 includes the dielectric layer 14, the layer of DSEs 22, the protective layer 32, and the dielectric layer 52.

Figure 6:
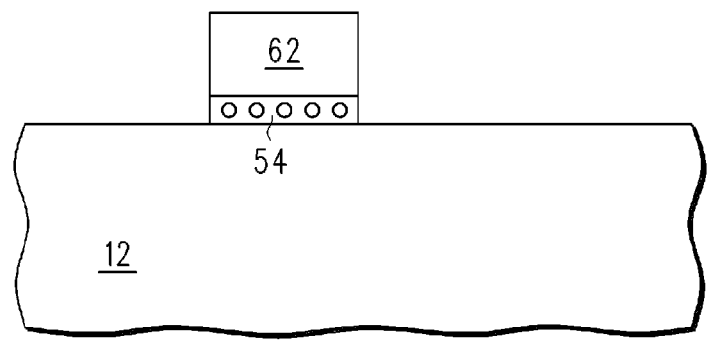
FIG. 6 includes an illustration of a cross-sectional view of the workpiece of FIG. 5 after forming a gate electrode.

FIG. 6 includes an illustration of a gate electrode 62 overlying the charge storage stack 54. A conductive layer (not illustrated) is deposited over the charge storage stack 54 and is then patterned and etched to form the gate electrode 62. In the illustrated embodiment, the gate electrode 62 serves as a control gate to help control the flow of charges into and out of the charge storage stack 54. The gate electrode 62 includes a conductive material such as a metal, a metal alloy, a metal compound, a doped semiconductor material (e.g. polysilicon), or any combination thereof. In one embodiment, the gate electrode 62 has a thickness in a range of approximately 50 to approximately 500 nm. The gate electrode 62 is formed using a conventional or proprietary physical vapor deposition ("PVD") process, chemical vapor deposition ("CVD") process, atomic layer deposition ("ALD") process, or any combination thereof followed by a conventional or proprietary lithographic process.

Figure 7:
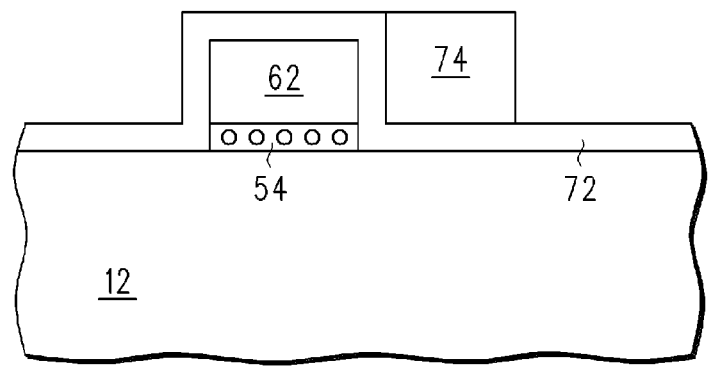
FIG. 7 includes an illustration of a cross-sectional view of the workpiece of FIG. 6 after forming another gate electrode.

FIG. 7 includes an illustration of the workpiece 10 after forming a dielectric layer 72 and a gate electrode 74. A dielectric layer 72 is deposited or grown over the substrate 12, followed by the deposition of a conductive layer (not illustrated). The conductive layer is patterned and etched to form the gate electrode 74. In one embodiment, the gate electrode 74 serves as a select gate for the memory cell.

Figure 8:
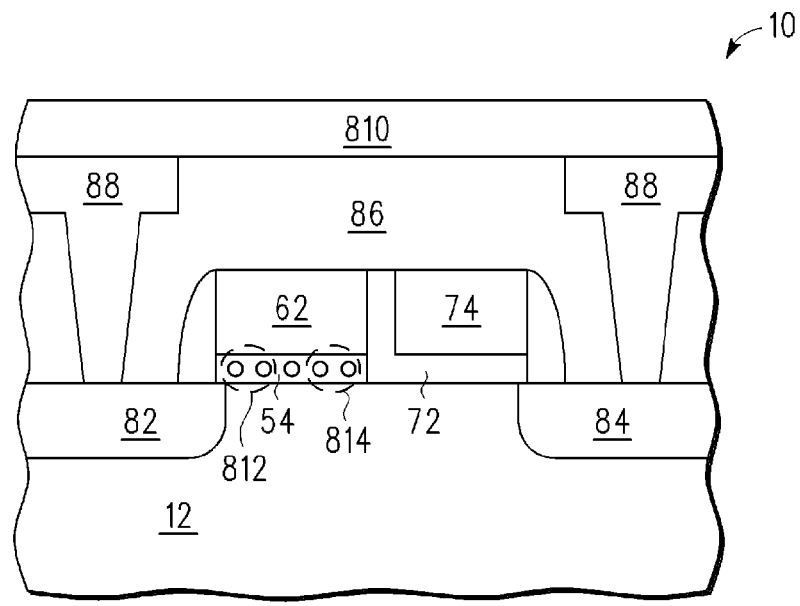
FIG. 8 includes an illustration of a cross-sectional view of a substantially complete electronic device.
Figure 9:
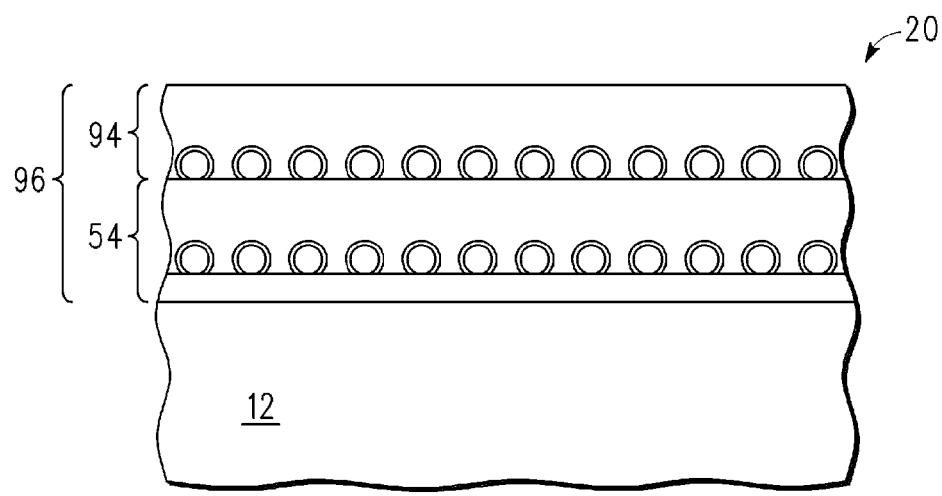
FIG. 9 includes an illustration of a cross-sectional view of the workpiece of FIG. 5 after forming another layer of discontinuous storage elements according to an alternative embodiment.

FIG. 8 includes an illustration of a substantially complete electronic device. In the illustrated embodiment, dopant is introduced to the substrate 12 to form doped regions 82 and 84 adjacent to the electrode 62 and the electrode 74, respectively. The doped regions 82 and 84 serve as source/drain regions for the memory cell. An insulating layer 86 is formed over the memory cell. Openings are formed in the insulating layer 86, and an interconnect layer 88 is formed to allow electrical connection to the doped regions 82 and 84. An encapsulating layer 810 can be formed to serve as a final passivation layer for the electronic device. The doped regions 82 and 84, the insulating layer 86, interconnect layer 88, and the encapsulating layer 810 are formed using conventional or proprietary doping, deposition, and lithographic processes. Another embodiment may include other structures and have another configuration. For example, the electronic device may have multiple interconnect layers.

Thus, in one embodiment, an electronic device is formed including a dielectric layer 52 that is substantially hydrogen-free. By forming the dielectric layer 52 from a layer 42 that is substantially hydrogen-free, the dielectric layer 52 includes less hydrogen than would be included in a conventional deposited dielectric film that has a silicon precursor including hydrogen. As such, the life of the charge storage stack 54, and therefore, the life of the electronic component, can be affected. Further, in another embodiment, the protective layer 32 protects the DSEs 22 during the formation of the dielectric layer 52 from the layer 42. In a particular embodiment, when the DSEs 22 and the layer 42 both include silicon as a majority component, the conversion of the layer 42 can be driven to completion without consuming DSEs 22 and substantially compromising ability of the charge storage stack 54 to store charge.

Regarding one embodiment, the programming of the illustrated memory cell, charges are stored at a location 812 or a location 814 within the charge storage stack 54. The location 812 lies adjacent to the doped region 82 and is programmed by hot carrier injection. Voltages are applied as indicated in TABLE 1 (below). As current flows within the channel region, hot carriers are injected into the charge storage stack 54 and stored in the DSEs 22 at the location 812. The location 814 lies adjacent to the gate electrode 74 and is programmed by source side injection ("SSI"). Voltages are applied as indicated in TABLE 1. As current flows within the channel region, hot carriers are injected into the charge storage stack 54 and are stored in the DSEs 22 at the location 814. In other embodiments, a charge storage layer would have only one charge storage location.

The charge storage stack can be erased by electrically floating ("F" in TABLE 1) or setting to 0 the gate electrode 74, the doped region 82, and the doped region 84 while forming at least a 12 V difference between the gate electrode 62 and the substrate 12. While listed in TABLE 1 as $\geq 12$ V on the gate electrode 62 and 0 V on the substrate 12, many combinations of values can be used that result in the gate electrode 62 having a potential at least a 12 V higher or lower than the substrate 12.

TABLE 1

|  | Doped region 82 | Gate electrode 62 | Gate electrode 74 | Doped region 84 | Substrate 12 |
| --- | --- | --- | --- | --- | --- |
| Program 812 | 5 to 7 V | 6 to 9 V | 2 to 4 V | 0 V | 0 V |
| Read 812 | 0 V | 3 to 5 V | 2 to 4 V | 0.5 to 2 V | 0 V |
| Program 814 | 4 to 6 V | 8 to 11 V | 2 to 4 V | 0 V | 0 V |
| Read 814 | 0.5 to 2 V | 3 to 5 V | 2 to 4 V | 0 V | 0 V |
| Erase | F or 0 V | $\geq 12$ V | F or 0 V | F or 0 V | 0 V |

Some applications may use more than a single layer of DSEs. According to an alternative embodiment illustrated in FIG. 9, a charge storage stack 94 can be formed over the charge storage stack 54 to form a composite charge storage stack 96. Processing proceeds according to an embodiment as previously described for FIGS. 1 through 5. The portion of the process, as described in an embodiment with respect to the FIGS. 2 through 5 is then repeated to form the charge storage stack 94. Individual portions of the charge storage stack 94 can include a different material, have a different thickness, or be formed by a different embodiment, than the corresponding individual portions of the charge storage stack 54. Although the composite charge storage stack 96 is illustrated including a single additional charge storage stack 94, substantially any number of charge storage stacks can be used to form the composite charge storage stack 96.

In a particular embodiment, the DSEs are silicon nanocrystals with an average diameter of approximately 2 nm, and the entire charge storage stack 96 is doped with Erbium. In such a case, the substrate 12 can act as an electrode for a radiation-emitting component. In a particular embodiment, the substrate 12, an electrode subsequently formed over the composite charge storage stack 96, or any combination thereof can be formed including a material transparent to a wavelength or spectrum of radiation produced when the electronic device would be used.

Many different aspects and embodiments are possible. Some of those aspects and embodiments are described below. After reading this specification, skilled artisans will appreciate that those aspects and embodiments are only illustrative and do not limit the scope of the present invention.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

In a first aspect, a process of forming an electronic device can include forming a first layer of discontinuous storage elements over a dielectric layer. The process can also include forming a second layer including silicon over the discontinuous storage elements and oxidizing at least substantially all of the second layer.

In one embodiment of the first aspect, the process can further include forming a gate electrode after oxidizing at least substantially all of second layer. In another embodiment, forming the second layer include forming the second layer from a silicon precursor having a chemical formula of $Si_ZX_{2Z+2}$, where Z is equal to 1, 2, or 3, and X includes F, Cl, Br, I, or any combination thereof. In a particular embodiment, can further include passivating the discontinuous storage elements prior to forming the second layer, wherein passivating the discontinuous storage elements includes forming a nitrogen-containing layer over the discontinuous storage elements.

In a more particular embodiment of the first aspect, oxidizing at least substantially all of the second layer can include forming a gate dielectric layer on the passivated discontinuous storage elements. In a still more particular embodiment, during oxidizing at least substantially all of the second layer, a silicon portion of the second layer can lie between an oxidized portion of the second layer and the first layer. In another embodiment, forming the second layer over the discontinuous storage elements can include forming the second layer using a silicon precursor that is substantially hydrogen-free. In still another embodiment, forming the second layer includes forming an amorphous silicon layer.

In a second aspect, an electronic device can include a substrate, a first dielectric layer, and a first layer of discontinuous storage elements wherein the first dielectric layer lies between the first layer of discontinuous storage elements and the substrate. The electronic device can also include a second dielectric layer overlying the discontinuous storage elements wherein the second dielectric layer is substantially hydrogen-free.

In a particular embodiment of the second aspect, the electronic device can include a nonvolatile memory cell. The nonvolatile memory cell can include the substrate and a charge storage stack. The charge storage stack can include the first dielectric layer, the first layer of discontinuous storage elements, and the second dielectric layer. In a more particular embodiment, the nonvolatile memory cell further includes a first doped region lying within the substrate, a second doped region lying with the substrate, and a channel region extending between the first doped region and the second doped region. The electronic device can further include a control gate lying adjacent to the channel region, wherein the charge storage stack lies between the control gate and the substrate, and a select gate lying adjacent to the channel region. In another embodiment, the electronic device can further include a second layer of discontinuous storage elements overlying the second dielectric layer.

In a third aspect, a process of forming an electronic device can include forming a layer of discontinuous storage elements over a dielectric layer and passivating the discontinuous storage elements. The process can also include forming a first silicon layer over the discontinuous storage elements after passivating the discontinuous storage elements, wherein forming the first layer is performed using a silicon precursor that is substantially hydrogen-free. The process can further include forming a dielectric layer where forming the dielectric layer includes oxidizing at least substantially all of the first layer.

In a one embodiment of the third aspect, passivating the discontinuous storage elements further includes placing the substrate in a nitrogen plasma. In another embodiment, forming the dielectric layer can include oxidizing at least substantially all of the first layer at a temperature greater than 650 degrees centigrade. In still another embodiment, the process can further include forming a gate electrode after forming the dielectric layer. In yet another embodiment, the process can further include forming a second layer including silicon after oxidizing the first layer.

In another embodiment of the third aspect, forming the first layer is performed using the silicon precursor including a halogen. In yet another embodiment, forming the first silicon layer is preformed in the presence of nitrogen, a noble gas, or any combination thereof. In still another embodiment, forming the first silicon layer is performed in an absence of a plasma.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

For example, although illustrated with a separate control gate electrode and select gate electrode, a memory cell including a charge storage stack having more or fewer gate electrodes could also benefit from using such a film. In another example, although illustrated as a planar component, a memory cell with at least a portion lying within a trench or including a semiconductor fin could also benefit from a substantially hydrogen-free film.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a first layer of discontinuous storage elements over a dielectric layer, wherein:
        the discontinuous storage elements have an average diameter of approximately 2 to approximately 20 nm; and
        at least some of the discontinuous storage elements are silicon nanocrystals;
    forming a second layer over the discontinuous storage elements and substantially all of the dielectric layer, wherein the second layer is a silicon layer having a thickness in a range of approximately 3 to approximately 9 nm;
    oxidizing substantially all of the second layer; and
    forming a gate electrode after oxidizing substantially all of the second layer, wherein the electronic device includes a memory cell comprising a set of the discontinuous storage elements and the gate electrode.

2. The process of claim 1, further comprising, before forming the second layer, passivating the discontinuous storage elements to form a protective layer that abuts the discontinuous storage elements, wherein passivating the discontinuous storage elements comprises:
    oxidizing a portion of the discontinuous storage elements to form an oxide; and
    nitridizing the oxide to form the protective layer.

3. The process of claim 2, wherein passivating the discontinuous storage elements is performed such that protective layer that is no greater than approximately 2 nm.

4. The process of claim 3, wherein:
    passivating the discontinuous storage elements includes forming a nitrogen-containing layer abutting the discontinuous storage elements; and
    forming the second layer is performed such that the second layer abuts the protective layer.

5. The process of claim 4, wherein oxidizing substantially all of the second layer includes forming a gate dielectric layer on the passivated discontinuous storage elements.

6. The process of claim 5, wherein during oxidizing substantially all of the second layer, a silicon portion of the second layer lies between an oxidized portion of the second layer and the first layer.

7. The process of claim 1, wherein forming the second layer include forming the second layer from a silicon precursor having a chemical formula of $Si_ZX_{2Z+2}$, where Z is equal to 1, 2, or 3, and X includes F, Cl, Br, I, or any combination thereof.

8. The process of claim 1, wherein forming the second layer over the discontinuous storage elements includes forming the second layer using a silicon precursor that is substantially hydrogen-free.

9. The process of claim 1, wherein forming the second layer includes forming an amorphous silicon layer.

10. A process of forming an electronic device comprising:
    forming a first dielectric layer over a substrate;
    forming a layer of discontinuous storage elements over the first dielectric layer, wherein at least some of the discontinuous storage elements are silicon nanocrystals;
    passivating the discontinuous storage elements to form a protective layer that abuts the discontinuous storage elements and is no greater than approximately 2 nm, wherein passivating the discontinuous storage elements comprises:
        oxidizing a portion of the discontinuous storage elements to form an oxide; and
        nitridizing the oxide to form the protective layer;
    forming a first layer over the discontinuous storage elements and abutting the protective layer after passivating the discontinuous storage elements, wherein forming the first layer is performed using a silicon precursor that is substantially hydrogen-free;
    forming a second dielectric layer abutting the protective layer, wherein forming the second dielectric layer includes oxidizing substantially all of the first layer; and
    forming a gate electrode over the first dielectric layer, the first layer of discontinuous storage elements, and the second dielectric layer,
    wherein each dielectric layer between the substrate and the gate electrode, excluding the second dielectric layer, has a dielectric constant in a range of 4 to approximately 9.

11. The process of claim 10, wherein passivating the discontinuous storage elements further includes placing the substrate in a nitrogen plasma.

12. The process of claim 10, wherein forming the second dielectric layer includes oxidizing at least substantially all of the first layer at a temperature greater than 650 degrees centigrade.

13. The process of claim 10, wherein forming the second first layer includes forming the first layer from a silicon precursor having a chemical formula of $Si_ZX_{2Z+2}$, where Z is equal to 1, 2, or 3, and X includes F, Cl, Br, I, or any combination thereof.

14. The process of claim 10, further including forming a second layer including silicon after oxidizing the first layer.

15. The process of claim 10, wherein forming the first layer is performed using the silicon precursor including a halogen.

16. The process of claim 10, wherein forming the first layer is preformed in the presence of nitrogen, a noble gas, or any combination thereof.

17. The process of claim 10, wherein:
    forming the first dielectric layer comprises growing the first dielectric layer from a substrate that includes silicon, germanium, carbon, or any combination thereof; and
    forming the first layer comprises forming an amorphous silicon layer.

18. The process of claim 10, wherein the discontinuous storage elements have an average diameter of approximately 2 to approximately 20 nm.

19. The process of claim 18, wherein the second layer is formed to a thickness in a range of approximately 3 to approximately 9 nm.

20. A process of forming an electronic device comprising:
forming a first dielectric layer over a substrate;
forming a layer of silicon nanocrystals over the first dielectric layer;
passivating the silicon nanocrystals to form a protective layer that abuts the silicon nanocrystals, wherein passivating the silicon nanocrystals comprises:
oxidizing the silicon nanocrystals to form an oxide; and
nitridizing the oxide to form the protective layer;
forming a silicon layer over the silicon nanocrystals and abutting the protective layer after passivating the silicon nanocrystals;
oxidizing substantially all of the silicon layer to form a second dielectric layer; and
forming a gate electrode over the first dielectric layer, the layer of silicon nanocrystals, and the second dielectric layer.

* * * * *

UNITED STATES PATENT AND TRADEMARK OFFICE
CERTIFICATE OF CORRECTION

| | | |
|---|---|---|
| PATENT NO. | : 7,932,189 B2 | Page 1 of 1 |
| APPLICATION NO. | : 11/627817 | |
| DATED | : April 26, 2011 | |
| INVENTOR(S) | : Tushar P. Merchant et al. | |

It is certified that error appears in the above-identified patent and that said Letters Patent is hereby corrected as shown below:

Column 10, Line 36, delete "first"
Column 10, Line 48, delete "second"

Signed and Sealed this
Eighteenth Day of October, 2011

David J. Kappos
*Director of the United States Patent and Trademark Office*